(12) United States Patent
Yuki et al.

(10) Patent No.: US 10,104,834 B2
(45) Date of Patent: Oct. 23, 2018

(54) ELECTRIC LAWN MOWER CONTROL APPARATUS

(71) Applicant: Honda Motor Co., Ltd., Tokyo (JP)

(72) Inventors: Toru Yuki, Wako (JP); Yoshihiko Yamagishi, Wako (JP); Shinsaku Nakayama, Wako (JP)

(73) Assignee: HONDA MOTOR CO., LTD., Tokyo (JP)

(*) Notice: Subject to any disclaimer, the term of this patent is extended or adjusted under 35 U.S.C. 154(b) by 5 days.

(21) Appl. No.: 15/610,943

(22) Filed: Jun. 1, 2017

(65) Prior Publication Data

US 2017/0354088 A1 Dec. 14, 2017

(30) Foreign Application Priority Data

Jun. 13, 2016 (JP) ................. 2016-117200

(51) Int. Cl.
*A01D 34/00* (2006.01)
*A01D 34/58* (2006.01)
(Continued)

(52) U.S. Cl.
CPC ....... *A01D 34/006* (2013.01); *A01D 34/6806* (2013.01); *A01D 34/78* (2013.01);
(Continued)

(58) Field of Classification Search
CPC .. A01D 34/6812; A01D 34/78; A01D 34/008; A01D 34/6806; A01D 34/001; A01D 34/006; A01D 69/02; A01D 69/025; A01D 34/82; B60L 7/14; G01P 3/44; G01R 31/3606; H02J 7/0068; H02J 7/1438; H02K 21/222; H02K 9/06; H02K 7/102; H02K 7/02; H02K 7/1815; H02K 1/30; H02K 1/32; H01M 10/0525; H01M 10/44; H01M 10/486; H02P 1/029; H02P 4/00;
(Continued)

(56) References Cited

U.S. PATENT DOCUMENTS 5,727,372 A * 3/1998 Kanitz ................... A01D 34/78
56/11.9
6,170,241 B1 * 1/2001 Shibilski .............. H02H 7/0833
318/434
(Continued)

FOREIGN PATENT DOCUMENTS

JP 2012196104 A 10/2012

*Primary Examiner* — Robert E Pezzuto
(74) *Attorney, Agent, or Firm* — Duft & Bornsen, PC

(57) ABSTRACT

An apparatus for controlling operation of a walk-behind electric lawn mower equipped with an electric motor, a blade cutter connected to the electric motor and a rechargeable battery mounted connected to the electric motor and a motor driver circuit. In the apparatus, when an instruction to stop the electric motor is inputted, the operation of the motor driver circuit is controlled to output regenerative electric current from three-phase coils of the electric motor. At that time, it is determined whether a rotational speed of the electric motor is equal to or less than a switching rotational speed and when it is, the motor driver circuit is controlled to switch from the regenerative braking to short-circuit braking that short-circuits the three-phase coils of the electric motor.

8 Claims, 7 Drawing Sheets

(51) Int. Cl.
| | |
|---|---|
| *A01D 34/78* | (2006.01) |
| *A01D 34/68* | (2006.01) |
| *A01D 34/82* | (2006.01) |
| *G01P 3/44* | (2006.01) |
| *G01R 31/36* | (2006.01) |
| *H01M 10/0525* | (2010.01) |
| *H01M 10/44* | (2006.01) |
| *H01M 10/48* | (2006.01) |
| *H02J 7/00* | (2006.01) |
| *H02J 7/14* | (2006.01) |
| *H02P 27/08* | (2006.01) |
| *B60L 7/14* | (2006.01) |
| *H02P 3/22* | (2006.01) |
| *A01D 101/00* | (2006.01) |
| *B60R 16/04* | (2006.01) |

(52) U.S. Cl.
CPC .............. *A01D 34/82* (2013.01); *B60L 7/14* (2013.01); *G01P 3/44* (2013.01); *G01R 31/3606* (2013.01); *H01M 10/0525* (2013.01); *H01M 10/44* (2013.01); *H01M 10/486* (2013.01); *H02J 7/0068* (2013.01); *H02J 7/1438* (2013.01); *H02P 3/22* (2013.01); *H02P 27/08* (2013.01); *A01D 2101/00* (2013.01); *B60R 16/04* (2013.01); *B60Y 2300/18125* (2013.01); *H01M 2220/20* (2013.01)

(58) Field of Classification Search
CPC .......... H02P 7/285; H02P 7/29; H02P 7/2913; H02P 27/08
USPC .......... 56/10.1, 10.2 A–10.2 G, 10.2 R, 10.8, 56/11.1, 16.7; 318/434, 440, 599, 430, 318/432, 139, 809, 811
See application file for complete search history.

(56) References Cited

U.S. PATENT DOCUMENTS

| | | | |
|---|---|---|---|
| 6,750,622 B2 * | 6/2004 | Simizu | A01D 34/006 318/139 |
| 6,987,328 B2 * | 1/2006 | Osborne | A01D 34/6806 290/1 A |
| 7,741,793 B2 * | 6/2010 | Lucas | H02P 4/00 318/139 |
| 7,884,560 B2 * | 2/2011 | Lucas | A01D 69/025 318/139 |
| 8,552,669 B2 * | 10/2013 | Kusakawa | H02P 7/29 318/139 |
| 9,192,096 B2 * | 11/2015 | Harris, III | A01D 34/008 |
| 9,787,225 B2 * | 10/2017 | Lucas | A01D 69/025 |
| 2014/0001987 A1 | 1/2014 | Okada | |

* cited by examiner

ELECTRIC LAWN MOWER CONTROL APPARATUS

CROSS-REFERENCE TO RELATED APPLICATIONS

This application is based upon and claims the benefit of priority from Japanese Patent Application No. 2016-117200 filed on Jun. 13, 2016, the contents of which are incorporated herein by reference.

BACKGROUND OF THE INVENTION

Field of the Invention

This invention relates to an electric lawn mower control apparatus, particularly to an apparatus for controlling operation of a walk-behind electric lawn mower movable over a lawn growth area hand-pushed by a user.

Description of Related Art

A walk-behind electric lawn mower of this type ordinarily comprises an electric motor mounted on a frame hand-pushed by a user and supplied with operating electric power from a rechargeable battery and is constituted to cut lawn or grass by rotationally driving a blade cutter installed on the undersurface of the frame using the electric motor.

Legal regulations require the blade cutter of a lawn mower to be stopped within a stipulated time (3 seconds) after the user inputs a stop instruction. Lawn mowers with on-board engines are therefore equipped with a clutch and a mechanical brake so the blade cutter can be stopped within the stipulated time.

As for electric lawn mowers, they are equipped with an electric motor that can be stopped within the stipulated time by implementing regenerative braking. Notwithstanding, when rotational speed of the electric motor slows, stopping within the stipulated time becomes difficult because regenerative braking force weakens.

In this connection, Japanese Unexamined Patent Publication No. 2012-196104 teaches a motor drive apparatus that enables mechanical brake downsizing or elimination by short-circuiting the motor coil to achieve adequate baking force even in a battery full-charge state that disables regenerative braking.

Although, as stated above, the technology of the reference responds to the battery being in full-charge state by switching from regenerative braking to short-circuit braking, fail-safe stopping within the stipulated time is apt to be difficult to achieve by merely switching from regenerative braking to short-circuit braking.

SUMMARY OF THE INVENTION

Therefore, the object of this invention is to overcome the aforesaid problem by providing an electric lawn mower control apparatus for a walk-behind lawn mower that reliably achieves electric motor stopping within a stipulated time by switching from regenerative braking to short-circuit braking.

In order to achieve the object, this invention provides an apparatus for controlling operation of a walk-behind electric lawn mower equipped with an electric motor, a blade cutter connected to the electric motor and a rechargeable battery mounted connected to the electric motor and a motor driver circuit. In the apparatus, when an instruction to stop the electric motor is inputted, the operation of the motor driver circuit is controlled to output regenerative electric current from three-phase coils of the electric motor. At that time, it is determined whether a rotational speed of the electric motor is equal to or less than a switching rotational speed and when it is, the motor driver circuit is controlled to switch from the regenerative braking to short-circuit braking that short-circuits the three-phase coils of the electric motor.

BRIEF DESCRIPTION OF THE DRAWINGS

The above and other objects and advantages will be more apparent from the following description and drawings, in which.

DETAILED DESCRIPTION OF THE INVENTION

In the following, an electric lawn mower control apparatus according to an embodiment of this invention is explained with reference to the attached drawings.

Figure 1:
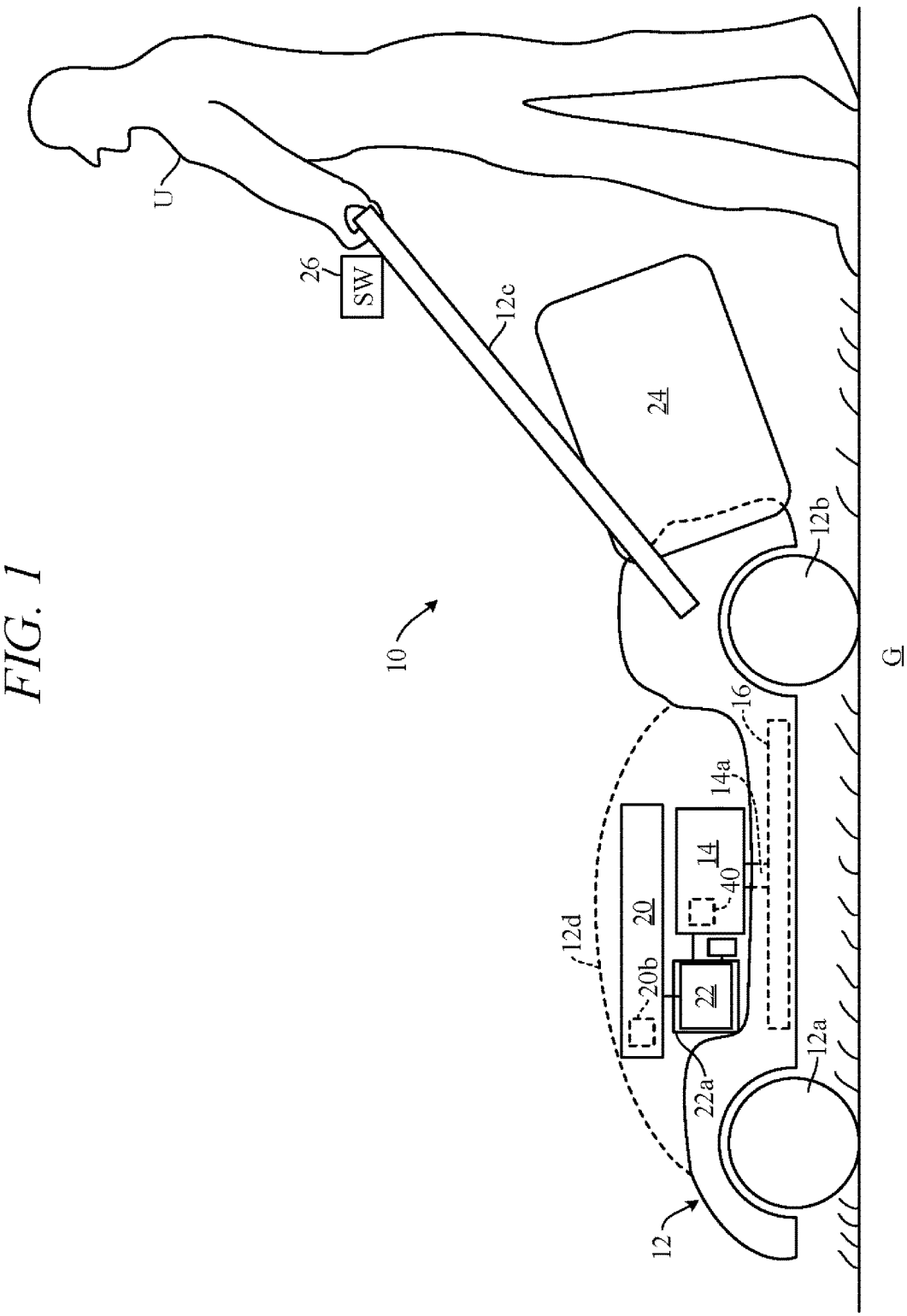
FIG. 1 is a schematic diagram generally illustrating an electric lawn mower control apparatus according to this invention.

FIG. 1 is a schematic diagram generally illustrating the electric lawn mower control apparatus according to this invention.

In FIG. 1, reference symbol 10 designates an electric lawn mower (hereinafter called "lawn mower") equipped with a frame 12. The frame 12 is provided thereon with an electric motor (hereinafter called "motor") 14, a blade cutter 16, a rechargeable battery (hereinafter called "battery") 20, and an electronic circuit board 22 accommodated in a case 22a.

The battery 20 is a lithium-ion battery or other such chargeable battery having a high energy density compared to that of the common lead battery. The battery 20 is charged by regenerative electric current generated by the electric motor 14 during braking of rotation of the blade cutter 16.

The frame 12, which is shaped like a car body as illustrated, is equipped on the bottom with pairs of front wheels 12a and rear wheels 12b (only those on near side shown) and provided with a handle 12c, and is adapted to be movable over a lawn growth area G by a user U pushing the handle 12c by hand from behind.

The motor 14 is located near the center of the frame 12. Although not illustrated, the undersurface of the frame 12 is cut out in circular shape at the location of the motor 14 to form a hollow cylindrically shaped cutter chamber, and the blade cutter 16 (and a blower (not shown)) are rotatably housed therein. The top of the frame 12 is covered by a cover 12d.

The blade cutter 16 and blower are connected to an output shaft 14a of the motor 14 and configured to cut grass on the lawn growth area G when the blade cutter 16 is rotationally driven by the motor 14. The blower blows grass clippings toward a discharge outlet (not shown) and from there rearward to be collected in a grass bag 24 attached to the back end of the frame 12. A switch (SW) 26 is provided near the handle 12c such that the user U can operate to input start and stop instructions to the motor 14.

Figure 2:
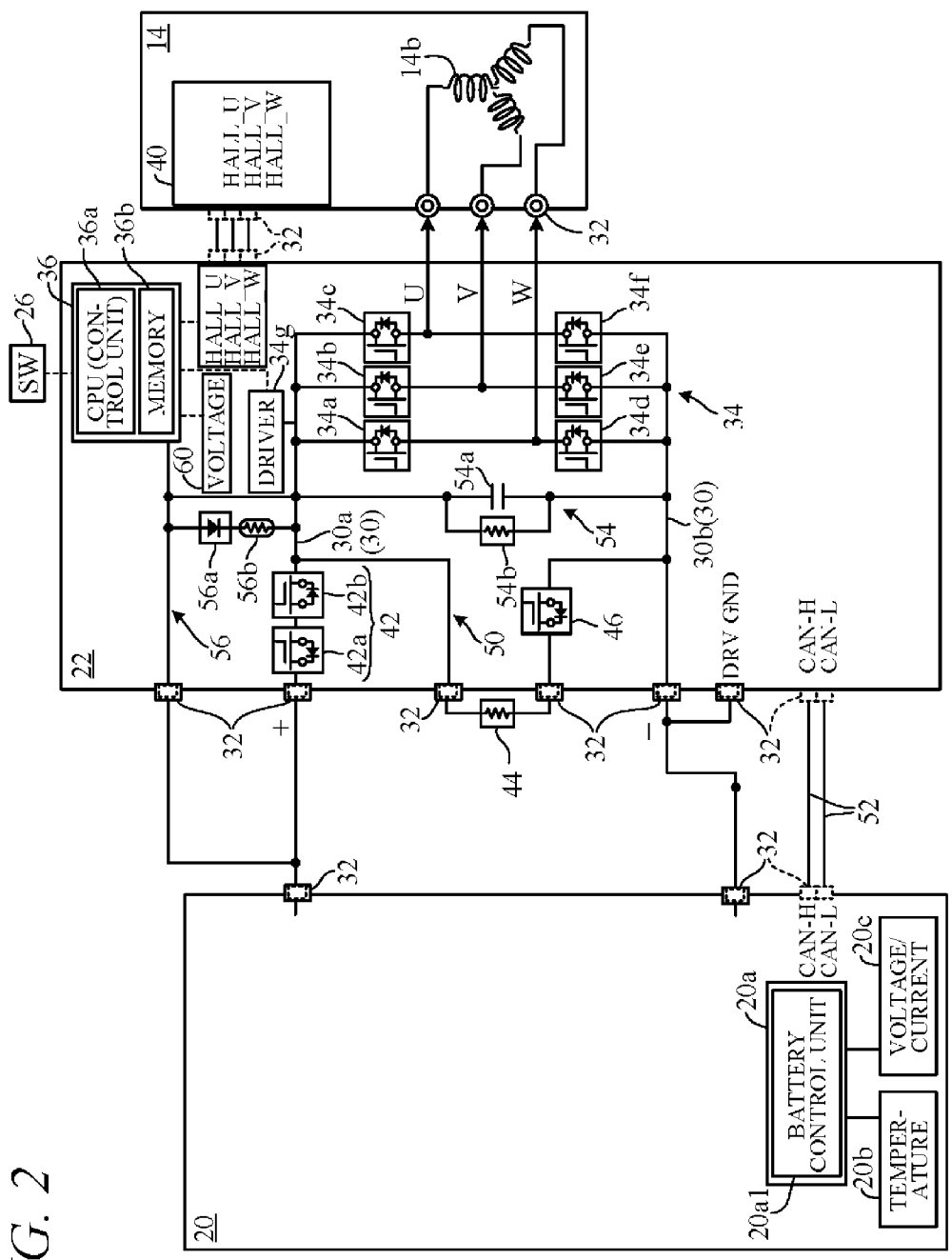
FIG. 2 is a block diagram showing electrical connective relationship among constituent components of the apparatus of FIG. 1.

FIG. 2 is a block diagram showing electrical connective relationship among constituent components of the apparatus of FIG. 1.

As illustrated, a current path 30 connecting the battery 20 and the motor 14 is formed on an electronic circuit board 22. The current path 30 comprises a positive side current path 30a and a negative side current path 30b. Symbols 32 in FIG. 2 indicate terminals.

A motor driver circuit (hereinafter called "driver circuit") 34 for adjusting supply of operating electric power to the motor 14 is connected to the current path 30. Specifically, the driver circuit 34 is connected between the positive side current path 30a and the negative side current path 30b.

The motor 14 is a three-phase brushless DC motor of multipolar outer structure comprising on the outside, for example, a flywheel-type rotor having multiple sets of permanent magnets arranged on an inner peripheral surface and on the inside opposing the same a rotor having multiple projections wound with U, V and W three-phase coils 14b arranged at 120° intervals.

The driver circuit 34 is more exactly an inverter circuit comprising multiple sets of bridge-connected gate elements, namely, six gate elements 34a, 34b, 34c, 34d, 34e and 34f constituted of insulated-gate FETs and parasitic diodes, three on the positive side and three on the negative side, and a driver 34g for outputting drive voltage to and adjusting operation of the gates of the six gate elements.

An ECU (Electronic Control Unit) 36 comprises a microcomputer having at least one CPU (processor) 36a and a memory 36b coupled to the CPU 36a, wherein the CPU 36a is configured to control operation of the driver circuit 34, i.e., the CPU 36a is configured to perform as a control unit (control means) that controls operation of the driver circuit 34 through the driver 34g is implemented on the electronic circuit board 22. The ECU 36 is supplied operating electric power from the current path 30.

Specifically, the ECU 36, more precisely the CPU (control unit) 36a responds to an instruction to start the motor 14 inputted by the user U through the switch 26 by PWM-controlling operation of the driver 34g so as to apply discharge power of the battery 20 discharged through the current path 30 as operating electric power sequentially in order of phase to the gates of the six gate elements 34a to 34f respectively connected to the U, V and W coils, thereby rotating the motor 14.

Further, the ECU 36, i.e., the CPU (control unit) 36a responds to the instruction to stop the motor 14 inputted by the user U through the switch 26 by driving the respective gate elements at a timing matched to sequential generation of induced electromotive voltage in the U, V and W phases so as to perform regeneration that drives the three-phase coils 14b to generate regenerative electric current during braking of rotation of the blade cutter 16. The so-generated regenerative electric current is supplied to the battery 20 as regenerative electric current through the current path 30, i.e., through the positive side current path 30a and negative side current path 30b.

More specifically, the ECU 36, i.e., the CPU (control unit) 36a responds to the instruction to stop the motor 14 inputted by the user U through the switch 26 drives the respective gate elements 34a, 34b, 34c in the positive side U, V and W phases to block electric current from the battery 20. Under such state, as shown in FIGS. 3 and 4, the CPU (control unit) 36a controls the negative side U phase gate element 34f in the PWM manner at a timing when positive induced electromotive force occurs at U phase, and turns the V phase gate element 34e ON.

Figure 3:
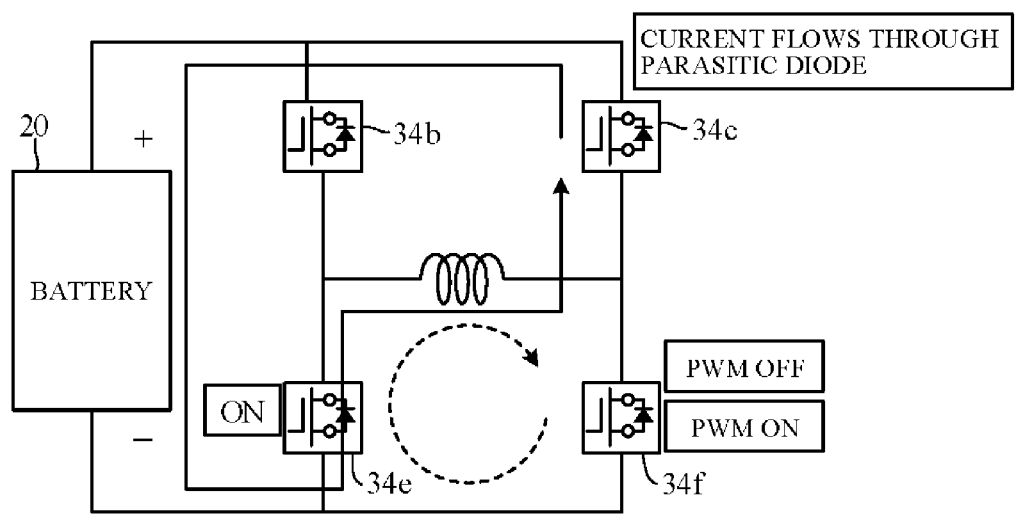
FIG. 3 is an explanatory diagram explaining regenerative braking operation of a motor driver circuit of FIG. 2.
Figure 4:
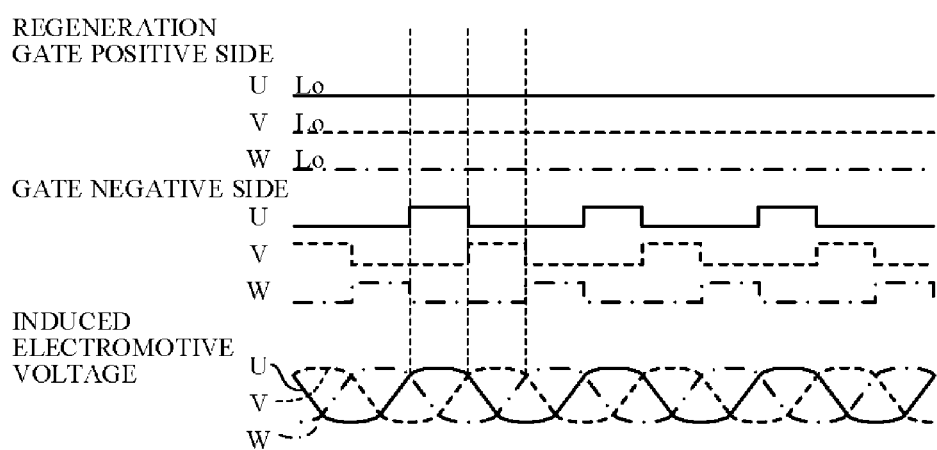
FIG. 4 is a time chart showing the regenerative braking operation of FIG. 4.

As shown in FIG. 3 by a broken line, current circulates between U phase gate element 34f and V phase gate element 34e when turned ON in the PWM control and internal voltage is accordingly raised. On the other hand, when turned OFF in the PWM control, as shown by a solid line in the figure, current flows in a charge direction between the parasitic diode of the positive side U phase gate element 34c and the negative side V phase gate element 34e.

Similarly, the CPU (control unit) 36a controls the negative side V phase gate element 34e in the PWM manner at a timing when positive induced electromotive voltage occurs at V phase, and turns the W phase gate element 34d ON. Next, the CPU (control unit) 36a controls the negative side W phase gate element 34d in the PWM manner at a timing when positive induced electromotive voltage occurs at W phase, and turns the U phase gate element 34f ON. The CPU (control unit) 36a repeats the control so that regenerative current is generated in the three-phase coils 14b.

Further, when conducting the regenerative operation in response to an instruction to stop the motor 14 inputted by the user U through the switch 26, the CPU (control unit) 36a determines whether rotational speed (motor speed) of the motor 14 is less than a switching rotational speed (explained later).

If the determination is affirmative, the CPU (control unit) 36a controls operation of the driver 34g to short-circuit the three-phase coil 14b. Specifically, the CPU (control unit) 36a turns all of the positive side U, V, W gate elements 34a, 34b, 34c OFF to block the current supply from the battery 20, while turning all of the negative side U, V, W gate elements 34d, 34e, 34f ON, such that current circulates among the three phases depending on the direction in which the induced electromotive voltage occurs.

Figure 5:
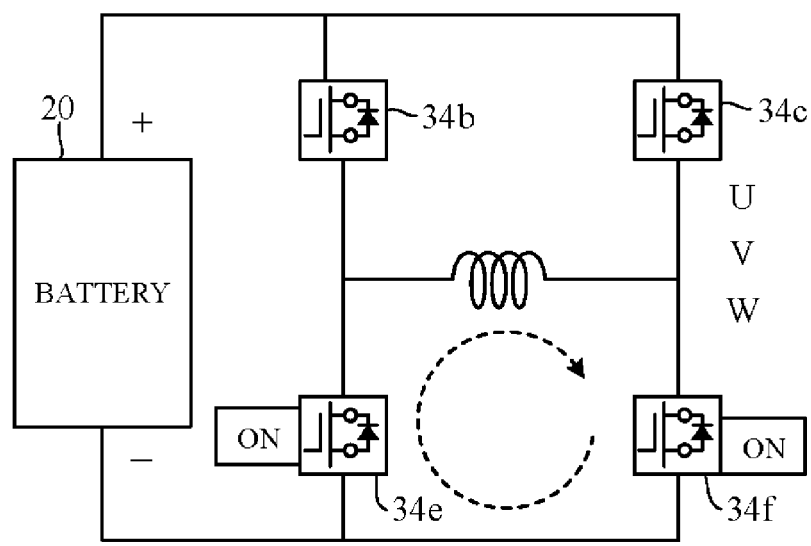
FIG. 5 is an explanatory diagram explaining short-circuit braking operation of a motor driver circuit of FIG. 2.
Figure 6:
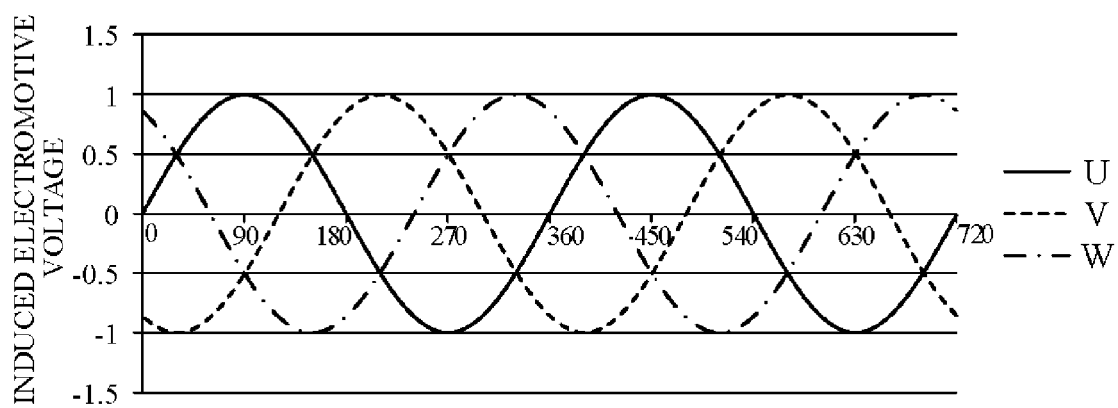
FIG. 6 is a time chart showing the short-circuit braking operation of FIG. 5.

FIG. 5 is a simplified diagram of the bridge-connected driver circuit 34 shown in FIG. 2 and illustrates current flow when positive induced electromotive voltage occurs at the U phase. Since the current circulates among the three phases, occurred induced electromotive voltage becomes always zero when viewed from DC side, as shown in FIG. 6.

That is, since the negative side gate elements 34d, 34e, 34f are all turned ON, current is about to flow all of the three phases. However, since the positive side gate elements are all turned OFF, only the current of the induced electromotive voltage flows the motor 14. Since this current flows in a direction that is opposite to that at ordinary motor driving operation, thereby enabling to generate a braking force.

Returning to the explanation of FIG. 2 three Hall element sensors 40 are disposed in the motor 14 and generate outputs in accordance with position of the rotor and rotational speed of the motor 14. The outputs of the Hall element sensors 40 are inputted to the electronic circuit board 22 and sent to the ECU 36. The ECU 36a, more precisely the control unit 36a controls the operation of the driver 34g in the foregoing manner based thereon.

The current path 30, specifically its positive side current path 30a, incorporates two switching elements 42 in series connection, namely a charge switching element 42a and a discharge switching element 42b, both constituted of insulated-gate FETs and parasitic diodes similarly to the gate elements of the driver circuit 34.

Passage of charge current from the motor 14 to the battery 20 is allowed when the charge switching element 42a is turned ON and blocked when it is turned OFF. Passage of discharge current from the battery 20 to the motor 14 is allowed when the discharge switching element 42b is turned ON and blocked when it is turned OFF.

By inserting the charge switching element 42a that allows passage of charge current from the motor 14 to the battery 20 and the discharge switching element 42b that allows passage of discharge current from the battery 20 to the motor 14 into the current path 30 in series connection in this manner, i.e. so as to establish ON/OFF selectability, charge and discharge can be easily controlled.

Moreover, a braking resistor (resistance; hereinafter referred to as "resistor") 44 is inserted into the current path 30, specifically between the positive side current path 30a and the negative side current path 30b, and a regenerative resistance switching element 46 constituted of an insulated-gate FET and a parasitic diode similarly to the charge switching element 42a is inserted in series with the resistor 44.

The regenerative resistance switching element 46 allows charge current stored in the driver circuit 34 during regeneration by the motor 14 to pass to the resistor 44 when turned ON and blocks the same when turned OFF.

More precisely, the resistor 44 and the regenerative resistance switching element 46 are inserted in a connection circuit 50 that connects a point downstream of the charge switching element 42a/discharge switching element 42b to the negative side current path 30b, and the resistor 44 in the connection circuit 50 is placed outside the electronic circuit board 22 so as to reduce effect of heat generated by current flow.

The battery 20 is equipped with a microcomputer 20a that has a temperature sensor (rechargeable battery temperature detector) 20b configured to produce an output indicating a temperature of the battery 20 and a voltage/current sensor (rechargeable battery residual capacity detector) 20c configured to produce an output indicating a state of charge of the battery 20, i.e., a residual capacity of the battery 20.

The microcomputer 20a has at least one processor (CPU) and a memory coupled thereto and the processor is configured to perform as a battery control unit 20a1 that permits charging of the battery 20 based on the outputs of the sensors 20b and 20c.

The microcomputer 20a of the battery 20 and the electronic circuit board 22 are connected by two (high-level and low-level) CAN (Control Area Network) communication lines 52, by which signals representing detected temperature, residual capacity, discharge permission and the like of the battery 20 are sent from the battery control unit 20a1 to the control unit 36a of the ECU 36. Alternatively, whether charging of the battery 20 is permitted can be determined by the ECU 36.

The positive side current path 30a and negative side current path 30b are connected by a second connection circuit 54. The second connection circuit 54 is provided with a smoothing capacitor 54a that by absorbing pulsations smooths regenerative electric current during rectification from alternating current to direct current. A resistor 54b connected in parallel with the smoothing capacitor 54a stabilizes against voltage drops and the like caused by load fluctuation.

In addition, the positive side current path 30a is branched off and the branch is connected to the electronic circuit board 22 through a terminal 32 to form a branch circuit 56 connected to the positive side current path 30a at a location downstream of the charge switching element 42a/discharge switching element 42b.

A diode 56a and a resistor 56b are inserted in the branch circuit 56 in series to function as pre-charge resistance that prevents inrush current from flowing into the smoothing capacitor 54a when the discharge switching element 42b is turned ON.

Further, a voltage sensor (internal circuit voltage detector) 60 constituted of a sensing resistor is provided in a voltage-dividing circuit that divides voltage of the positive side current path 30a and supplies it to the ECU 36 as operating electric power, and the voltage sensor is configured to produce an output indicating an internal circuit voltage of the driver circuit 34 to the ECU 36, i.e., the CPU (control unit) 36a.

Figure 7:
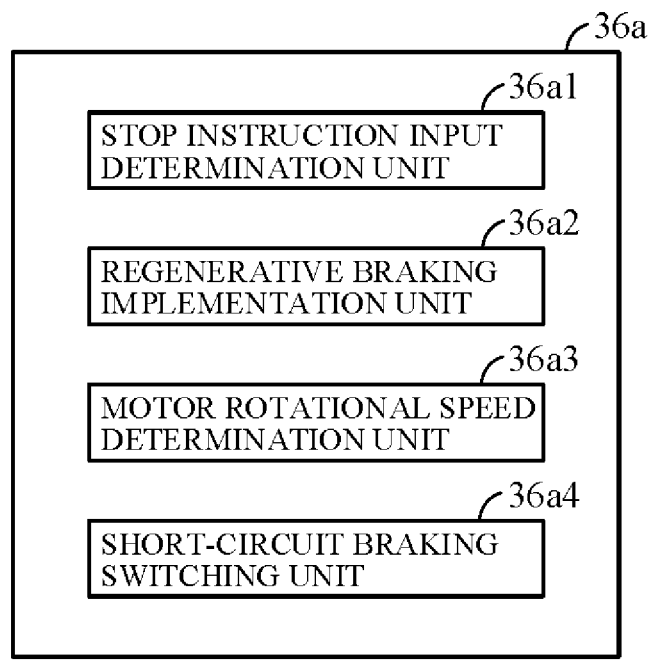
FIG. 7 is a block diagram functionally representing configuration of an ECU of FIG. 2.

FIG. 7 is a block diagram functionally representing the configuration of the ECU 36, i.e., the CPU (control unit) 36a.

As mentioned above, the ECU 36 comprises a microcomputer having the CPU (processor) 36a and the memory 36b, wherein the CPU 36a is configured to perform as a control unit that controls operation of the driver circuit 34. In addition thereto, the control unit 36a is configured to perform as a stop instruction input determination unit (determination means) 36a1, a regenerative braking implementation unit (implementation means) 36a2, a motor rotational speed determination unit (determination means) 36a3, and a short-circuit braking switching unit (switching means) 36a4. In other words, the CPU (processor) 36a is configured to determine stop instruction, to implement regenerative braking, to determine motor rotational speed and to switch to short-circuit braking.

Figure 8:
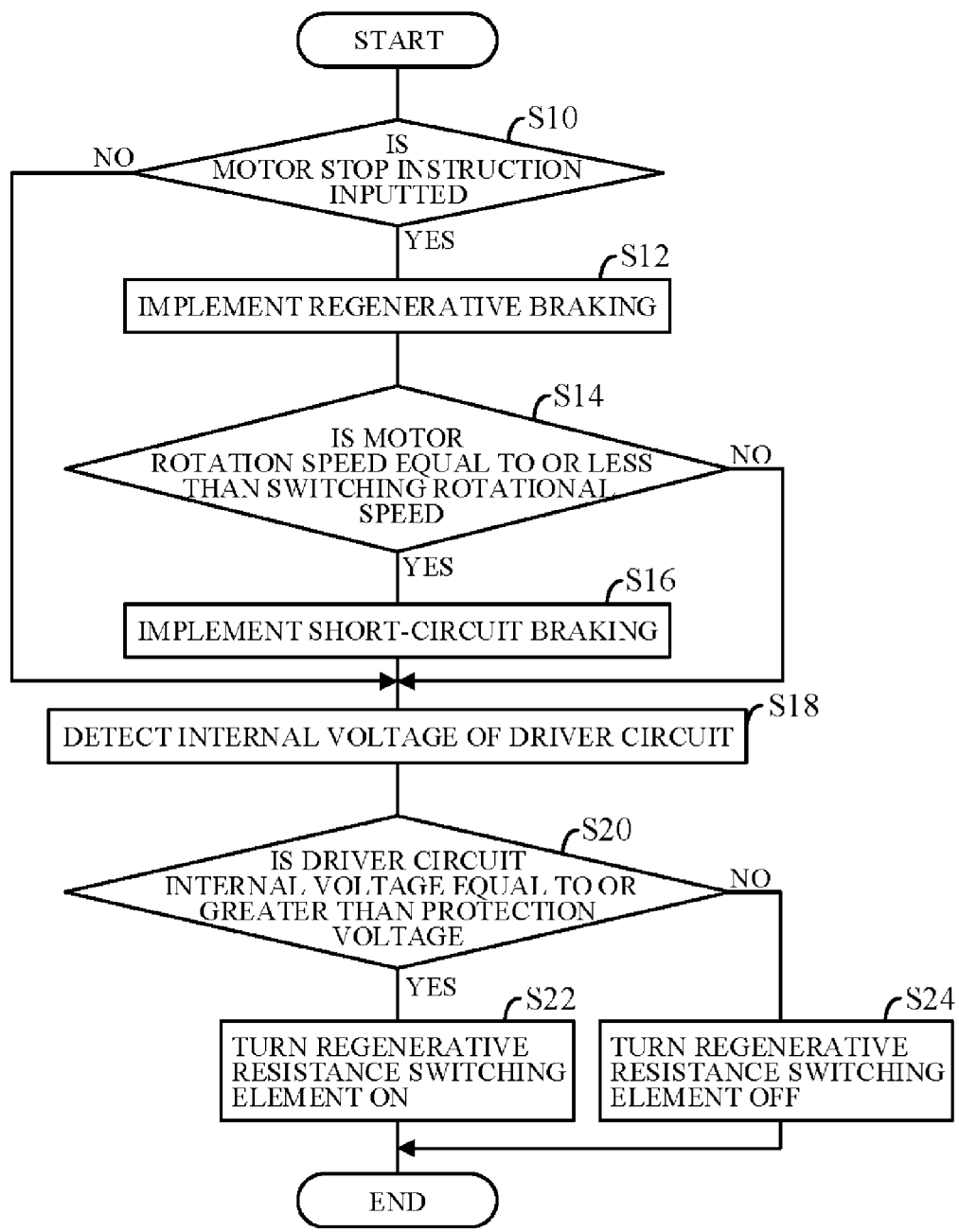
FIG. 8 is a flowchart showing operations of the ECU of FIG. 7.

FIG. 8 is a flowchart showing operations of the stop instruction input determination unit 36a1 and other units of the CPU (control unit) 36a, namely, operations of the apparatus of FIG. 1.

Now to explain, in S10, it is determined whether the user U inputs the motor 14 stop instruction through the switch 26. When the result in S10 is NO, the program skips processing steps up to and including S16.

When the result in S10 is YES, i.e., when input of the motor 14 stop instruction is determined, the program goes to S12, in which operation of the driver circuit 34 is controlled to implement regenerative braking like the aforesaid that outputs regenerative electric current from the three-phase coils 14b of the motor 14.

Next, in S14, it is determined whether rotational speed of the motor 14 is equal to or below the aforesaid switching rotational speed. That is to say, after regenerative braking is implemented in S12, it is determined whether rotational speed of the motor 14 is equal to or less than the switching rotational speed, and when the result in S14 is YES, the program goes to S16, in which short-circuit braking that short-circuits the aforesaid three-phase coils 14b is implemented, i.e., braking is switched from the regenerative braking to the short-circuit braking. When the result in S14 is NO, the processing of S16 is skipped.

Figure 9:
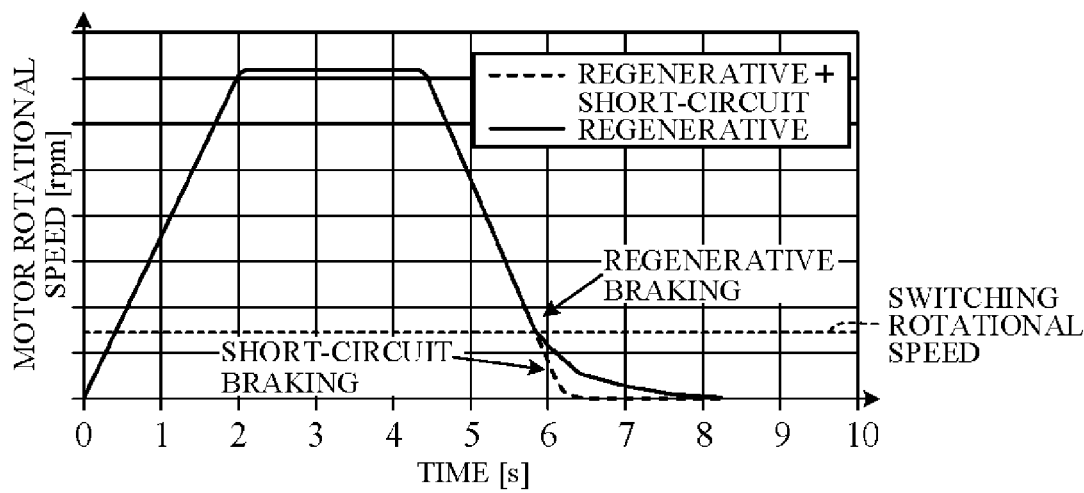
FIG. 9 is a time chart showing temporal change of an electric motor shown in FIG. 2.
Figure 10:
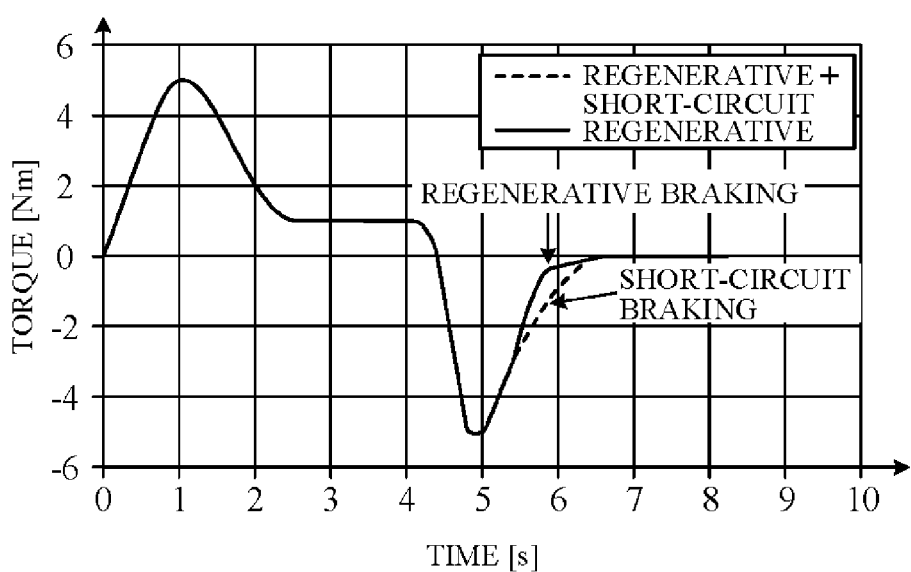
FIG. 10 is a time chart showing temporal change of torque at that time.

FIG. 9 is a time chart showing temporal change of motor 14 rotational speed during regenerative braking. FIG. 10 is a time chart showing temporal change of torque at this time. Regenerative braking is obtained by converting rotational kinetic energy of the motor 14 to electrical energy through the driver circuit 34. Adequate braking force is therefore difficult to obtain in the low rotational speed range where generated electric energy is low.

In this embodiment, therefore, the "switching rotational speed" is set to a value corresponding to a threshold value of the low rotational speed region beyond which desired braking force to stop the blade cutter 16 within a stipulated time is hard to obtain. In other words, the switching rotational speed is set to a threshold value of the low rotational speed region beyond which desired braking force is hard to obtain.

The regenerative braking is switched to short-circuit braking when rotational speed of the motor 14 falls to or below this switching rotational speed. Desired braking force is therefore ensured, because, as shown in FIG. 10, the switch to short-circuit braking increases pull-in torque just where pull-in torque solely by regenerative braking falls deficient with declining motor 14 rotational speed.

The switch from regenerative braking to short-circuit braking in this case is implemented by differentiating voltage application to the gate elements of the driver circuit 34, but in terms of motor 14 operation it amounts to adding short-circuit braking pull-in torque to regenerative braking pull-in torque and therefore enables switching from regenerative braking to (regenerative braking+short-circuit braking).

Returning to the flowchart of FIG. 8, next, in S18, internal voltage of the driver circuit 34 is detected from the output of the voltage sensor 60. This is also done when the result in S10 is NO. Next, in S20, whether the internal voltage of the driver circuit 34 detected from the voltage sensor 60 is equal to or greater than an appropriately set protection voltage is determined.

When the result in S20 is YES, i.e. when the internal voltage is determined to be equal to greater than the protection voltage, the program goes to S22, in which the regenerative resistance switching element 46 is turned ON to allow passage of charge current from the motor 14 to the braking resistor 44. The "protection voltage" here is set to a value that voltage of the driver circuit 34 is to be prevented from reaching or exceeding So, as explained earlier, the negative side current path 30*b* and the positive side current path 30*a* are connected, and regenerative electric current stored in the driver circuit 34 flows into and is consumed by the braking resistor 44, whereby internal voltage of the driver circuit 34 can be inhibited from rising excessively. Execution of this processing when no instruction to stop the motor 14 has been inputted is particularly effective for realizing smooth regenerative braking upon input of a stop instruction.

On the other hand, when the result in S20 is NO, i.e. when the detected internal voltage of the driver circuit 34 is determined to be lower than the predetermined protection voltage, no problem of internal voltage rising excessively is present, so the program goes to S24, in which the regenerative resistance switching element 46 is turned OFF to block passage of charge current from the motor 14 to the braking resistor 44.

As stated above, the embodiment is configured to have an apparatus for controlling operation of a walk-behind electric lawn mower (10) equipped with a frame (12) configured to be movable over a lawn growth area by a user by hand from behind; an electric motor (14) having three-phase coils (14*b*) and mounted on the frame; a blade cutter (16) provided at an underneath surface of the frame to be connected to the electric motor and configured to cut grass on the lawn growth area when driven by the electric motor; a rechargeable battery (20) mounted on the frame to be connected to the electric motor and configured to discharge electric power so as to apply to the electric motor as operating electric power and to be charged by a regenerative electric current that is generated by the electric motor during regenerative braking of rotation of the blade cutter; a motor driver circuit (34) configured to adjust supply of the operating electric power to the three-phase coils of the electric motor: and a control unit (36*a*) configured to control operation of the motor driver circuit; characterized in that: the control unit includes; a stop instruction input determination unit (36*a*1) configured to determine whether an instruction to stop the electric motor is inputted by the user; a regenerative braking implementation unit (36*a*2) configured to control the operation of the motor driver circuit (34) to implement regenerative braking that outputs regenerative electric current from the three-phase coils (14*b*) of the electric motor (14), when it is determined by the stop instruction input determination unit that the instruction to stop the electric motor is inputted; a motor rotational speed determination unit (36*a*3) configured to determine whether a rotational speed of the electric motor is equal to or less than a switching rotational speed, when the regenerative braking is implemented by the regenerative braking implementation unit; and a short-circuit braking switching unit (36*a*4) configured to control the operation of the motor driver circuit to switch from the regenerative braking to short-circuit braking that short-circuits the three-phase coils (14*b*) of the electric motor (14), when it is determined by the rotational speed determination unit that the rotational speed of the electric motor is equal to or less than the switching rotational speed.

More precisely, the processor of the control unit (36*a*) is configured to perform; determining whether an instruction to stop the electric motor is inputted by the user (S36*a*1); controlling the operation of the motor driver circuit to implement regenerative braking that outputs regenerative electric current from the three-phase coils of the electric motor, when it is determined that the instruction to stop the electric motor is inputted (36*a*2); determining whether a rotational speed of the electric motor is equal to or less than a switching rotational speed, when the regenerative braking is implemented (36*a*3); and controlling the operation of the motor driver circuit to switch from the regenerative braking to short-circuit braking that short-circuits the three-phase coil of the electric motor, when it is determined unit that the rotational speed of the electric motor is equal to or less than the switching rotational speed (36*a*4).

With this, configuration stopping is reliably achieved within the stipulated time because the electric motor 14 reliably braked, even when electric motor rotational speed is low, owing to the switching to short-circuit braking while in a regenerative braking force functional operating state. Moreover, this configuration also reduces need for size and/or weight reduction of the blade cutter 16, provision of a mechanical braking mechanism, and other such modification.

In the apparatus, the control unit further includes: an internal circuit voltage detector (60) configured to detect an internal voltage of the motor driver circuit (34); a resistor (44) interposed in a current path (30) connecting the rechargeable battery (20) and the electric motor (34); and a regenerative resistance switching element (46) interposed in the current path in series with the resistor to allow charge current to pass from the electric motor to the resistor when turned ON and block the charge current to pass from the electric motor to the register when turned OFF; and the control unit (36*a*) turns ON the regenerative resistance switching element (46) to allow the charge current to pass from the electric motor to the resistor when the internal voltage of the motor driver circuit detected by the internal circuit voltage detector is equal to or greater than a predetermined voltage.

With this, in addition to the advantages and effects mentioned above, internal voltage of the driver circuit 34 can be inhibited from rising excessively. Execution of this processing when no instruction to stop the motor 14 has been inputted is particularly effective for realizing smooth regenerative braking upon input of a stop instruction.

In the apparatus, the switching rotational speed is set to a value corresponding to a threshold value of a low rotational speed region beyond which desired braking force to stop the blade cutter within a stipulated time is hard to obtain.

With this, in addition to the advantages and effects mentioned above, it becomes possible to ensure desired braking force because the switch to short-circuit braking increases pull-in torque just where pull-in torque solely by regenerative braking falls deficient with declining motor rotational speed.

In the apparatus, a charge switching element (42a) and a discharge switching element (42b) are provided in series in the current path.

With this, in addition to the advantages and effects mentioned above, it becomes possible to easily control charge and discharge.

The apparatus further includes; an electronic control unit (36) having at least one processor (36a) and a memory coupled to the processor, wherein the processor (36a) is configured to perform as the control unit (36).

With this, in addition to the advantages and effects mentioned above, it becomes possible to make configuration simple, while enhancing performance of the control unit.

It should be noted in the above, although the invention is described with reference to a walk-behind electric lawn mower, the invention can be applied to any other type of utility vehicles.

While the present invention has been described with reference to the preferred embodiments thereof, it will be understood, by those skilled in the art, that various changes and modifications may be made thereto without departing from the scope of the appended claims.

What is claimed is:

1. An apparatus for controlling operation of a walk-behind electric lawn mower equipped with
    a frame configured to be movable over a lawn growth area by a user by hand from behind;
    an electric motor having three-phase coils and mounted on the frame;
    a blade cutter provided at an underneath surface of the frame to be connected to the electric motor and configured to cut grass on the lawn growth area when driven by the electric motor;
    a rechargeable battery mounted on the frame to be connected to the electric motor and configured to discharge electric power so as to apply to the electric motor as operating electric power and to be charged by a regenerative electric current that is generated by the electric motor during regenerative braking of rotation of the blade cutter;
    a motor driver circuit configured to adjust supply of the operating electric power to the three-phase coils of the electric motor: and
    a control unit configured to control operation of the motor driver circuit;
    wherein the improvement comprises:
    the control unit includes;
        a stop instruction input determination unit configured to determine whether an instruction to stop the electric motor is inputted by the user;
        a regenerative braking implementation unit configured to control the operation of the motor driver circuit to implement regenerative braking that outputs regenerative electric current from the three-phase coils of the electric motor, when it is determined by the stop instruction input determination unit that the instruction to stop the electric motor is inputted;
        a motor rotational speed determination unit configured to determine whether a rotational speed of the electric motor is equal to or less than a switching rotational speed, when the regenerative braking is implemented by the regenerative braking implementation unit; and
        a short-circuit braking switching unit configured to control the operation of the motor driver circuit to switch from the regenerative braking to short-circuit braking that short-circuits the three-phase coils of the electric motor, when it is determined by the rotational speed determination unit that the rotational speed of the electric motor is equal to or less than the switching rotational speed.

2. The apparatus according to claim 1, wherein the control unit further includes:
    an internal circuit voltage detector configured to detect an internal voltage of the motor driver circuit;
    a resistor interposed in a current path connecting the rechargeable battery and the electric motor; and
    a regenerative resistance switching element interposed in the current path in series with the resistor to allow charge current to pass from the electric motor to the resistor when turned ON and block the charge current to pass from the electric motor to the register when turned OFF; and
    the control unit turns ON the regenerative resistance switching element to allow the charge current to pass from the electric motor to the resistor when the internal voltage of the motor driver circuit detected by the internal circuit voltage detector is equal to or greater than a predetermined voltage.

3. The apparatus according to claim 1, wherein the switching rotational speed is set to a value corresponding to a threshold value of a low rotational speed region beyond which desired braking force to stop the blade cutter within a stipulated time is hard to obtain.

4. The apparatus according claim 1, wherein a charge switching element and a discharge switching element are provided in series in the current path.

5. An apparatus for controlling operation of a walk-behind electric lawn mower equipped with
    a frame configured to be movable over a lawn growth area by a user by hand from behind;
    an electric motor having three-phase coils and mounted on the frame;
    a blade cutter provided at an underneath surface of the frame to be connected to the electric motor and configured to cut grass on the lawn growth area when driven by the electric motor;
    a rechargeable battery mounted on the frame to be connected to the electric motor and configured to discharge electric power so as to apply to the electric motor as operating electric power and to be charged by a regenerative electric current that is generated by the electric motor during regenerative braking of rotation of the blade cutter;

a motor driver circuit configured to adjust supply of the operating electric power to the three-phase coils of the electric motor: and an electronic control unit having at least one processor and a memory coupled to the processor; and configured to control operation of the motor driver circuit;

wherein the improvement comprises:

the processor of the control unit is configured to perform;

determining whether an instruction to stop the electric motor is inputted by the user;

controlling the operation of the motor driver circuit to implement regenerative braking that outputs regenerative electric current from the three-phase coils of the electric motor, when it is determined that the instruction to stop the electric motor is inputted;

determining whether a rotational speed of the electric motor is equal to or less than a switching rotational speed, when the regenerative braking is implemented; and controlling the operation of the motor driver circuit to switch from the regenerative braking to short-circuit braking that short-circuits the three-phase coil of the electric motor, when it is determined unit that the rotational speed of the electric motor is equal to or less than the switching rotational speed.

6. The apparatus according to claim 5, wherein the control unit further includes:

an internal circuit voltage detector configured to detect an internal voltage of the motor driver circuit;

a resistor interposed in a current path connecting the rechargeable battery and the electric motor; and a regenerative resistance switching element interposed in the current path in series with the resistor to allow charge current to pass from the electric motor to the resistor when turned ON and block the charge current to pass from the electric motor to the register when turned OFF; and the processor of the control unit is configured to turn ON the regenerative resistance switching element to allow the charge current to pass from the electric motor to the resistor when the internal voltage of the motor driver circuit detected by the internal circuit voltage detector is equal to or greater than a predetermined voltage.

7. The apparatus according to claim 5, wherein the switching rotational speed is set to a value corresponding to a threshold value of a low rotational speed region beyond which desired braking force to stop the blade cutter within a stipulated time is hard to obtain.

8. The apparatus according claim 5, wherein a charge switching element and a discharge switching element are provided in series in the current path.

* * * * *